(12) United States Patent
Sheu

(10) Patent No.: US 6,370,774 B1
(45) Date of Patent: Apr. 16, 2002

(54) RADIATOR WITH THIN FINS AND METHOD FOR PRODUCING THE SAME

(76) Inventor: Ling-Po Sheu, 4F., No. 3, Lane 210, Fuyan St., Taipei (TW)

( * ) Notice: Subject to any disclaimer, the term of this patent is extended or adjusted under 35 U.S.C. 154(b) by 0 days.

(21) Appl. No.: 09/644,522

(22) Filed: Aug. 21, 2000

(51) Int. Cl.$^7$ ................................................. B23P 15/26
(52) U.S. Cl. ..................... 29/890.039; 29/557; 165/80.3
(58) Field of Search ............................. 29/890.03, 557, 29/428; 165/80.3, 185

(56) References Cited

U.S. PATENT DOCUMENTS

| | | | | |
|---|---|---|---|---|
| 4,669,535 A | * | 6/1987 | Seidler | 165/185 |
| 5,419,041 A | * | 5/1995 | Ozeki | 29/890.03 |
| 5,558,155 A | * | 9/1996 | Ito | 165/80.3 |
| 5,758,418 A | * | 6/1998 | Chrysler et al. | 29/890.03 |
| 6,000,132 A | * | 12/1999 | Butler | 29/890.03 |

* cited by examiner

Primary Examiner—I Cuda-Rosenbaum
(74) Attorney, Agent, or Firm—Pro-Techtor International Services

(57) ABSTRACT

A radiator with thin fins and a method for manufacturing the radiator are provided. The method includes steps of forming a plurality of thin fins and spacers by punching metal sheets of high coefficient of heat transmission into predetermined shapes, spacing said thin fins alternately with said spacers and binding them into an assembly with a plurality of rivets extended through holes separately formed near lower end at predetermined positions, and grinding a bottom of the assembly to remove unevenness thereof. The radiator manufactured in this method may include increased number of fins within a limited area to create largely increased contact surfaces with air and thereby enables quick radiation of heat produced by, for example, chips associated with the radiator. A fan may be mounted to a top of the radiator to enhance the radiating effect.

2 Claims, 5 Drawing Sheets

RADIATOR WITH THIN FINS AND METHOD FOR PRODUCING THE SAME

BACKGROUND OF THE INVENTION

The present invention relates to a radiator with thin fins, and also relates to a method for manufacturing this particular type of radiator. The method includes steps of forming thin fins and spacers with metal sheets having high coefficient of heat transmission, spacing the fins alternately with the spacers and riveting them together to form an assembly, and grinding a bottom of the assembly to remove unevenness thereof. The radiator so produced includes a plurality of thin fins within a reduced area to create largely increased contact surface with air and thereby enables quick radiation of heat.

It is known that a chip 1 (see FIG. 9) used, for example, in a computer would produce large amount of heat when it operates. To radiate the large amount of heat produced by the chip 1 to maintain normal operation of the chip 1, it is a common practice to associate a radiator with the chip 1. Conventionally, such radiator is formed from extruded aluminum. FIG. 1 illustrates an example of such conventional radiator 20. As can be seen from FIG. 1, the radiator 20 mainly includes a flat base 201 and a plurality of radiating ribs 202 vertically extended from and parallelly spaced on a top of the base 201. The radiator 20 is associated with the chip 1 by flatly attaching the base 201 to a top of the chip 1, so that heat produced by the chip 1 during operation thereof is absorbed by the base 201 and quickly transmitted to the a plurality of ribs 202. The ribs 202 provide large contacting surfaces with air to enable quick and continuous radiating of heat into the air via the surfaces of the ribs 202, so that the chip 1 is able to continue normal operation thereof without the risk of having a rising temperature.

As mentioned above, the radiator 20 is formed from aluminum extrusion. The ribs 202 on the top of the base 201 have a thickness that is restricted by the die through which aluminum material is extruded to form the radiator. It is currently impossible to make the ribs 202 of the extruded aluminum radiator 20 to have a very small thickness to increase the number of ribs 202 that may be provided on the base 201. The radiator 20 therefore provides only limited surfaces for contacting with air. This fact also inevitably causes the radiator 20 to have only limited radiating performance. Moreover, when the radiator 20 is to be used on a large heat-producing area, it is necessary to cut new dies having increased dimensions in order to extrude more aluminum material to form an enlarged radiator 20. The cost for cutting the new and large dies would adversely increase the cost of the radiator 20.

It is therefore desirable to develop a radiator that eliminates the drawbacks existing in the conventional ribbed radiator formed from extruded aluminum.

SUMMARY OF THE INVENTION

A primary object of the present invention is to provide a radiator having a plurality of thin fins and therefore providing largely increased contacting surface with air to enable accelerated radiating of heat.

Another object of the present invention is to provide radiator that has a plurality of thin fins and can be used with a radiator fan to achieve enhanced radiating effect.

The radiator with thin fins is manufactured in the following steps: forming a plurality of thin fins and spacers by punching metal sheets of high coefficient of heat transmission into predetermined shapes, spacing said thin fins alternately with said spacers and binding them into an assembly with a plurality of rivets extended through holes separately formed near lower end at predetermined positions, and grinding a bottom of the assembly to remove unevenness thereof. The radiator manufactured in this method may include increased number of fins within a limited area to create largely increased contact surface with air and thereby enables quick radiation of heat produced by, for example, a chip associated with the radiator.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
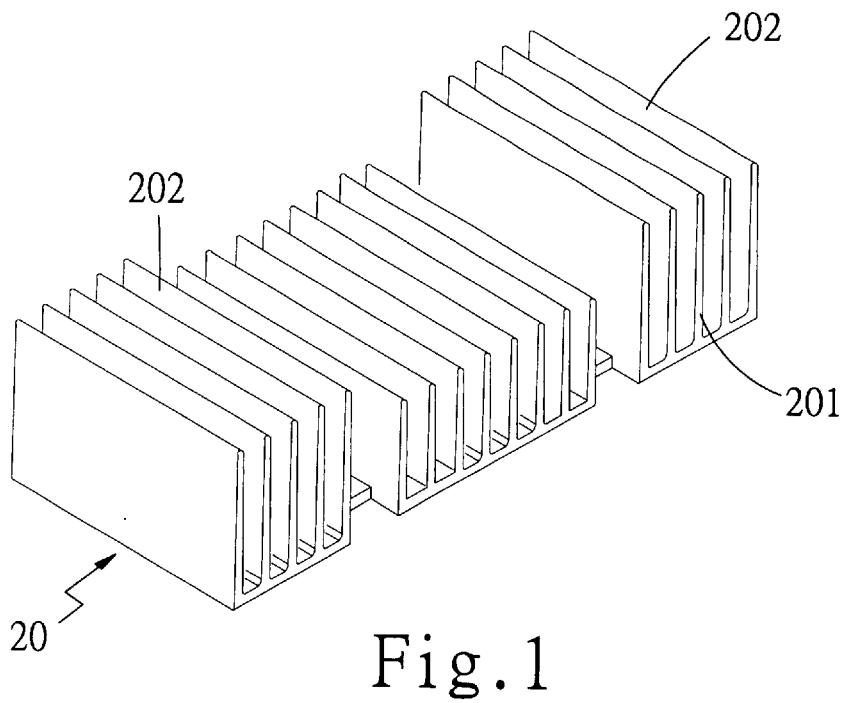
FIG. 1 is a perspective of a conventional ribbed radiator.
Figure 2:
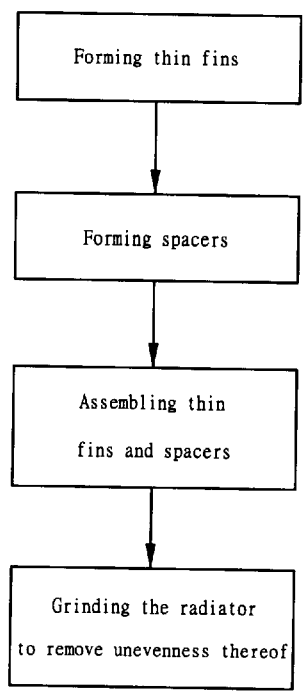
FIG. 2 is a flow chart showing steps of producing the radiator with thin fins according to the present invention.
Figure 3:
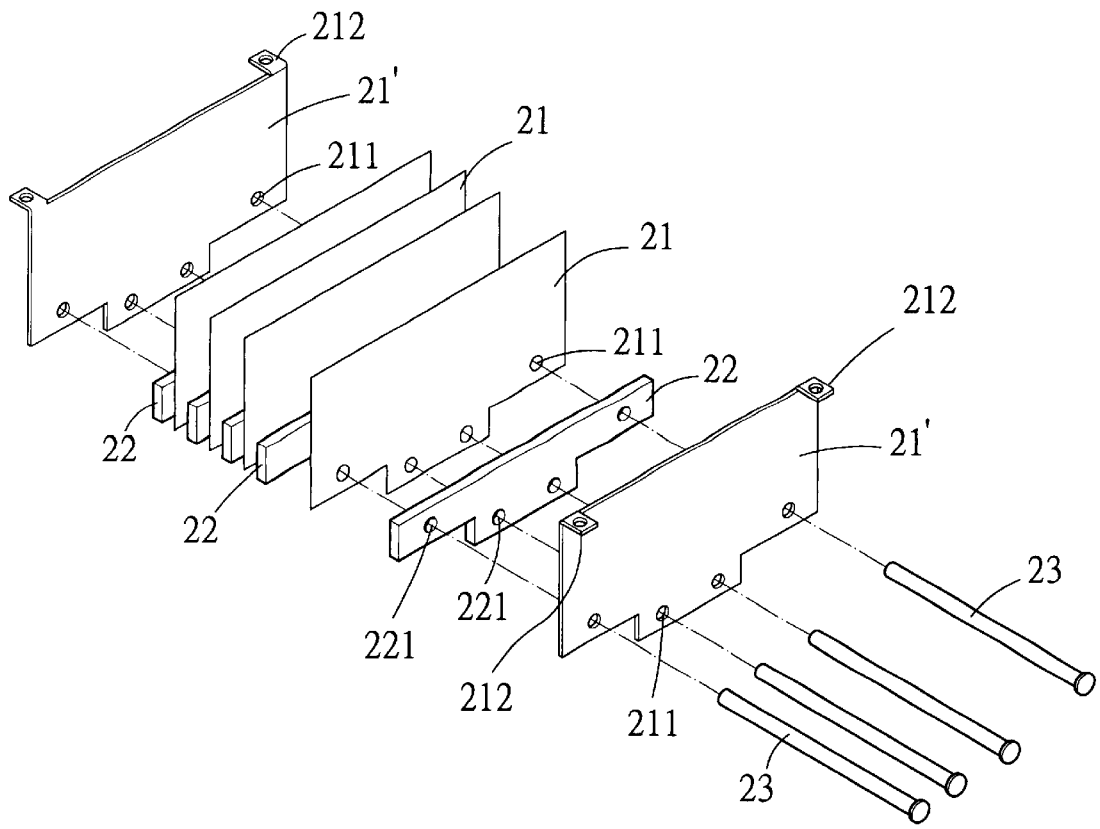
FIG. 3 is an exploded perspective of the radiator with thin fins according to the present invention.
Figure 8:
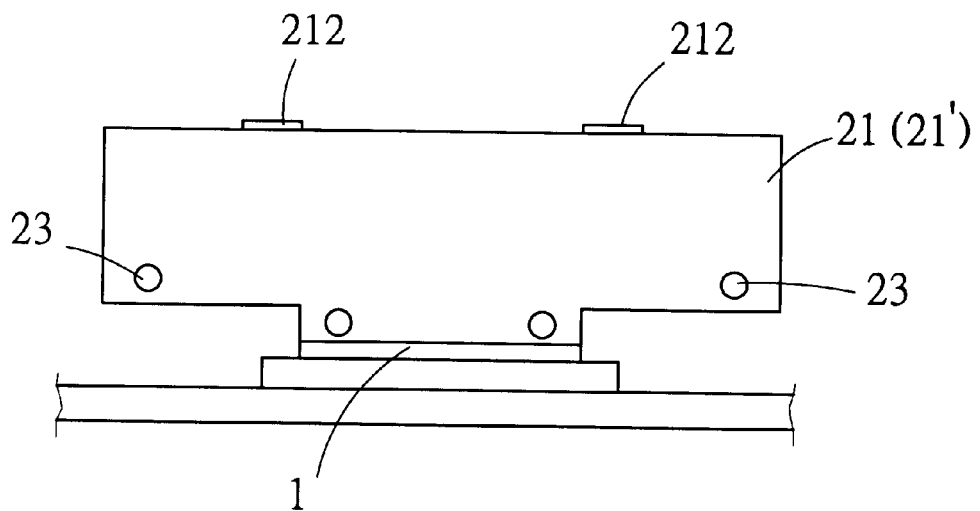
FIG. 8 is an assembled side view showing the radiator of the present invention being associated with a chip.

Please refer to FIG. 3 that is an exploded perspective of a finned radiator 2 according to the present invention for associating with a chip 1 (see FIGS. 8 and 9) to radiate heat produced by the chip 1 during operation thereof. As shown, the finned radiator 2 mainly includes a plurality of thin fins 21, a plurality of spacers 22, and a plurality of rivets 23. FIG. 2 is a flow chart of a method for manufacturing the finned radiator 2. As shown, the method includes the follow steps:

1. Forming the thin fins 21:

The thin fins 21 are formed by punching metal sheets having high coefficient of heat transmission into a desired flat and straight shape by using a die designed for this purpose, such that each of the thin fins 21 has a plurality of through holes 211 formed near a lower end at predetermined positions. The thin fins 21 may have dimensions depending on actual needs.

2. Forming the spacers 22:

The spacers 22 are also formed by punching metal sheets having high coefficient of heat transmission into a desired flat and straight shape by using a die designed for this purpose, such that each of the spacers 22 has a plurality of through holes 221 formed at predetermined positions corresponding to the through holes 211 on the thin fins 21. The formed spacers 22 are transversely extended long plates and have a height lower than that of the thin fins 21 and a thickness preferably larger than that of the thin fins 21.

3. Assembling the fins 21 and the spacers 22:

Assemble the thin fins 21 and the spacers 22 so that the thin fins 21 are spaced alternately with the spacers 22 and the through holes 211 separately align with the through holes 221, and then bind the assembled thin fins 21 and spacers 22 together by sequentially extending the rivets 23 through the aligned through holes 211 and 221 to provide a preform of the radiator 2.

Figure 4:
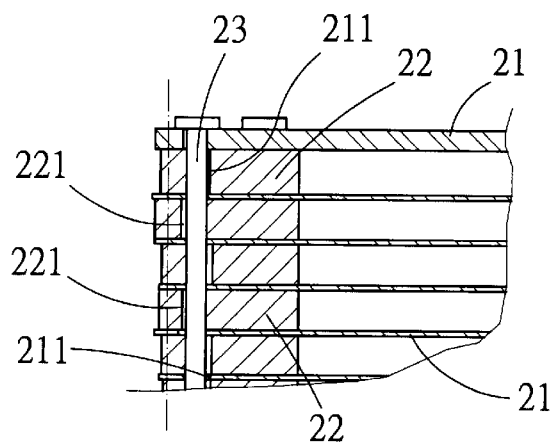
FIG. 4 is a fragmentary, assembled side view of the radiator of FIG. 3 before being ground to remove unevenness at a bottom thereof.
Figure 5:
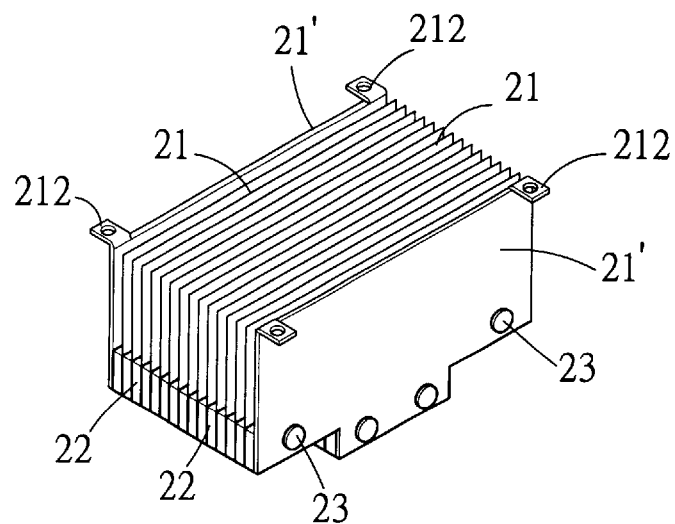
FIG. 5 is an assembled perspective of the radiator of the present invention.

4. Grinding and polishing:

When using the rivets 23 to rivet the fins 21 and the spacers 22 together, clearances between the through holes 211, 221 and the rivets 23 would possibly result in an uneven bottom of the preform of the radiator 2, as shown in FIG. 4. Use a suitable grinding tool to grind and smoothen the uneven bottom of the preform of the radiator 2 to provide a finished radiator 2 as shown in FIG. 5.

Figure 6:
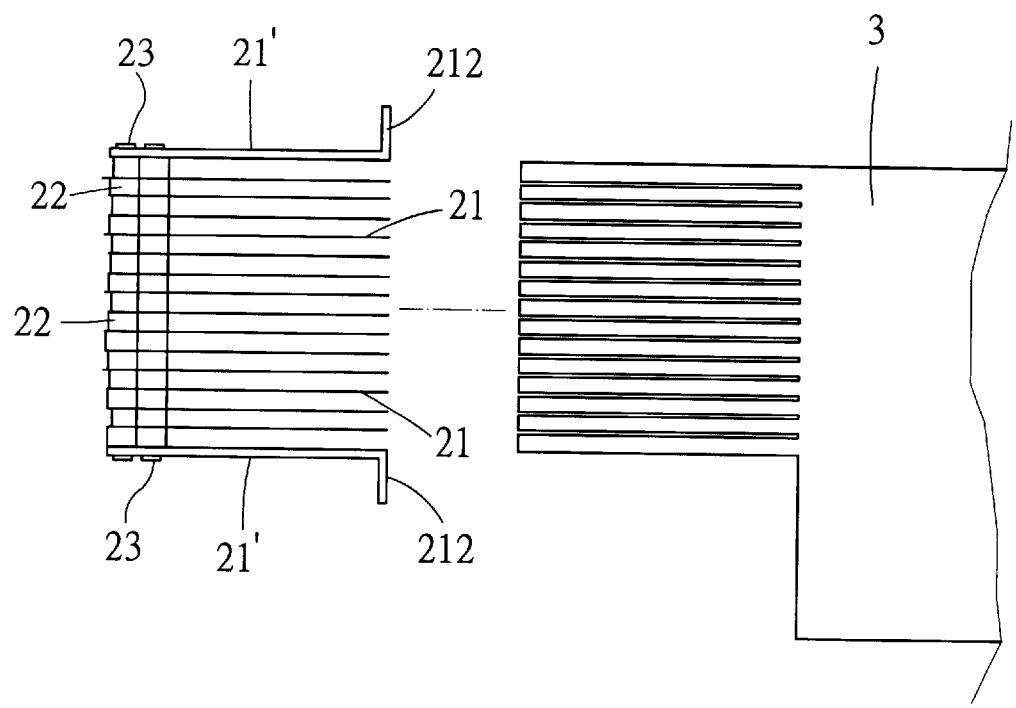
FIG. 6 schematically shows the manner of riveting the thin fins of the radiator together.

In assembling the thin fins 21 and the spacers 22 in the above step 3, an auxiliary tool 3 is used to ensure accurate and stable assembling of the thin fins 21 and the spacers 22. As can be seen in FIG. 6, the auxiliary tool 3 includes a front portion formed of a plurality of forward extend and parallelly spaced projections. The front portion of the auxiliary tool 3 is adapted to insert into the preliminarily assembled fins 21 and spacers 22 with the plurality of forward projections separately located in a space defined between two adjacent fins 21, so that the fins 21 spaced by the spacers 22 are well supported by the forward projections of the auxiliary tool 3. By this manner, the fins 21 would not bias while the rivets 23 are extended through the holes 211 and 221 to bind the fins 21 and the spacers 22 together.

Figure 7:
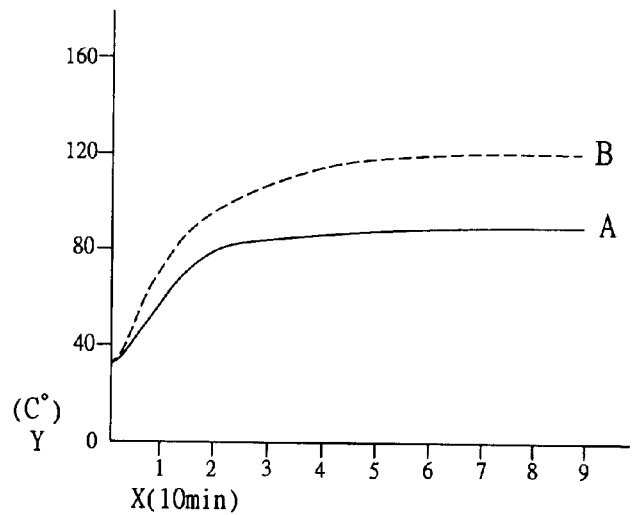
FIG. 7 is a graph in which two curves separately show the radiating effects achieved by the radiator of the present invention and the conventional ribbed radiator formed from extruded aluminum.

The metal sheets for producing the fins 21 and the spacers 22 may be, for example, aluminum sheet and copper sheet that all have high coefficient of heat transmission. Since the fins 21 have very small thickness compared with the conventional extruded aluminum ribs, there may be more fins 21 provided within a unit area to provide the radiator 2 with increased contact surfaces with air to enable accelerated radiating of heat produced by the chip 1. Experiments indicate the radiator 2 having thin fins 21 is more effective than the conventional ones in radiating heat. The experiment results are shown in FIG. 7 in which curve A indicates the temperature of a first chip 1 using the radiator 2 of the present invention, and curve B indicates the temperature of a second chip 1 identical to the first chip 1 but using a conventional extruded aluminum radiator 20. As can be seen from the graph of FIG. 7, the first and the second chips 1 that are tested at the same time present quite different radiating behavior, wherein the first chip 1 using the radiator 2 of the present invention has much lower temperature than the second chip 1 after both of them have operated for 20 minutes. This proves that the radiator 2 having thin fins 21 according to the present invention is superior to the conventional extruded aluminum radiator 20.

Figure 9:
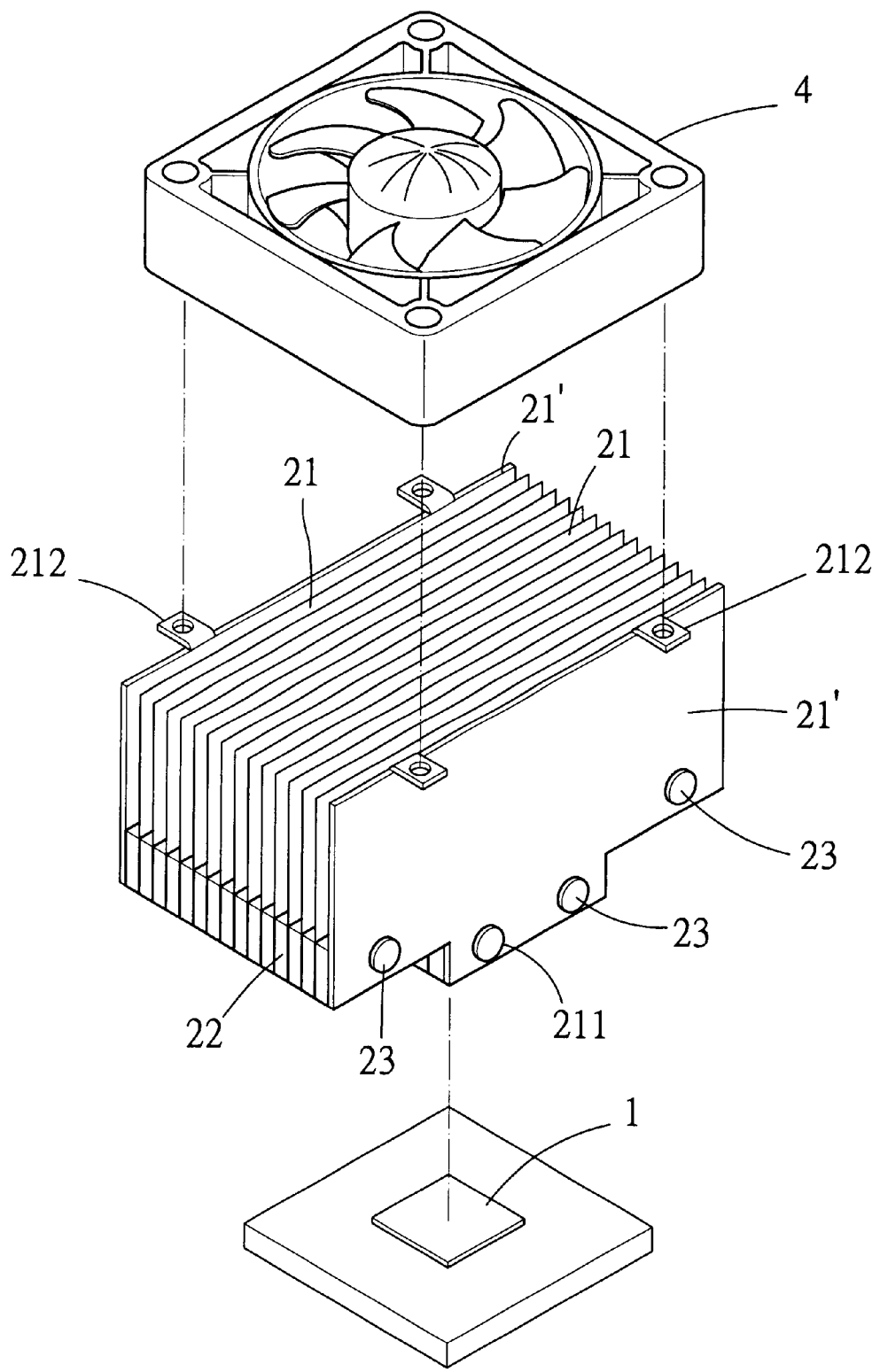
FIG. 9 is an exploded perspective showing the radiator of the present invention works with a radiator fan to enhance the radiating effect thereof.

To further enhance the radiating effect of the radiator 2 with thin fins 21, a radiator fan 4 may be mounted to a top of the radiator 2. To do so, two outmost fins 21' of the assembled thin fins 21 are separately provided at top edges with two spaced and outward extended ears 212 for the radiator fan 4 to fasten onto the ears 212, as shown in FIG. 9. The f an 4 and the radiator 2 could together more quickly radiate heat produced by the chip 1 and thereby effectively control the temperature of the chip 1 and protect the same from rising temperature.

An import ant feature of the radiator 2 of the present invention is that numbers of the thin fins 21 and the spacers 22 may be correspondingly increased to provide a radiator 2 adapted to associate with a large heat-producing area. In other words, the radiator 2 is not restricted to any particular dimensions. And, there is no need to make different dies for manufacturing the fins 21 and the spacers 22 of different sizes, and cost for such dies could be saved, accordingly.

What is claimed is:

1. A method for manufacturing a radiator with thin fins, comprising the steps of:

a. forming thin fins by punching metal sheets with dies so that a plurality of first through holes are formed near a lower end of said thin fins, said metal sheets having a high coefficient of heat transmission;

b. forming spacers by punching metal sheets with dies so that a plurality of second through holes are formed near a lower end of said spacers at positions corresponding to said first through holes, said spacers being elongated plates having a height smaller than that of said thin fins, and said spacers having a thickness larger than that of said thin fins, said metal sheets having a high coefficient of heat transmission;

c. assembling said thin fins and said spacers by spacing said thin fins alternately with said spacers and aligning said first through holes with said second through holes, and sequentially extending rivets through said aligned first and second through holes to fix said thin fins and said spacers together to provide a preform of said radiator; and d. grinding an uneven bottom of said preform of said radiator to remove any unevenness so that a finished product of said radiator is provided.

2. The method for manufacturing a radiator with thin fins as claimed in claim 1, wherein:

an auxiliary tool having a front portion provided with a plurality of forward extended and parallel projections is employed in step c, said auxiliary tool being adapted to be inserted into said preliminarily assembled thin fins and spacers with said forward projections located between pairs of adjacent thin fins, such that said thin fins are supported by said forward projections of said auxiliary tool while said rivets are extended through said aligned first and second through holes to bind said thin fins and said spacers together.

* * * * *